(12) United States Patent
Lin et al.

(10) Patent No.: US 12,123,092 B2
(45) Date of Patent: Oct. 22, 2024

(54) POWDER-ATOMIC-LAYER-DEPOSITION DEVICE WITH KNOCKER

(71) Applicant: SKY TECH INC., Hsinchu County (TW)

(72) Inventors: Jing-Cheng Lin, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 433 days.

(21) Appl. No.: 17/470,250

(22) Filed: Sep. 9, 2021

(65) Prior Publication Data

US 2022/0341036 A1    Oct. 27, 2022

(30) Foreign Application Priority Data

| Apr. 26, 2021 | (TW) | ................................ | 110114922 |
| Apr. 26, 2021 | (TW) | ................................ | 110114959 |
| Apr. 26, 2021 | (TW) | ................................ | 110114978 |

(51) Int. Cl.
| C23C 16/455 | (2006.01) |
| C23C 16/30 | (2006.01) |
| C23C 16/44 | (2006.01) |
| C23C 14/22 | (2006.01) |
| H01L 33/50 | (2010.01) |

(52) U.S. Cl.
CPC ........ *C23C 16/4407* (2013.01); *C23C 16/306* (2013.01); *C23C 16/4417* (2013.01); *C23C 16/45525* (2013.01); *C23C 16/45544* (2013.01); *C23C 16/45561* (2013.01); *C23C 14/223* (2013.01); *H01L 33/502* (2013.01)

(58) Field of Classification Search
None
See application file for complete search history.

(56) References Cited

U.S. PATENT DOCUMENTS

| 5,003,919 | A | * | 4/1991 | Yamamoto | ......... | G11B 5/70605 |
| | | | | | | 118/716 |
| 5,310,582 | A | * | 5/1994 | Vyakarnam | ............. | B05C 19/02 |
| | | | | | | 118/672 |
| 11,739,423 | B2 | * | 8/2023 | Lin | ..................... | C23C 16/4417 |
| | | | | | | 118/716 |

(Continued)

*Primary Examiner* — Binu Thomas
(74) *Attorney, Agent, or Firm* — Chun-Ming Shih; HDLS IPR SERVICES

(57) ABSTRACT

The present disclosure provides a powder-atomic-layer-deposition device with knocker, which mainly includes a vacuum chamber, a shaft seal, a drive unit and a knocker. The drive unit is connected to the rear wall of the vacuum chamber via the shaft seal, for driving the vacuum chamber to rotate. The shaft seal includes an outer tube and an inner tube, wherein the inner tube is disposed within the containing space of the outer tube. The inner tube is disposed with a gas-extracting pipeline and a gas-inlet pipeline therein, wherein the gas-extracting pipeline is for gas extraction of the vacuum chamber, the gas-inlet pipeline is for transferring a precursor gas into the vacuum chamber. The knocker and the vacuum chamber are adjacent to each other, for knocking the vacuum chamber to prevent powders within the reacting space from sticking to the inner surface of the vacuum chamber.

18 Claims, 10 Drawing Sheets

(56) References Cited

U.S. PATENT DOCUMENTS

| | | | |
|---|---|---|---|
| 2004/0255858 A1* | 12/2004 | Lee | C23C 16/45544 |
| | | | 118/715 |
| 2006/0172065 A1* | 8/2006 | Carlotto | B01J 2/006 |
| | | | 118/726 |
| 2011/0003088 A1* | 1/2011 | Honda | C23C 16/4417 |
| | | | 118/723 E |
| 2013/0059073 A1* | 3/2013 | Jiang | C04B 35/62222 |
| | | | 118/715 |
| 2017/0073807 A1* | 3/2017 | Kostamo | C23C 16/4412 |
| 2020/0024736 A1* | 1/2020 | Gangakhedkar | C23C 16/4408 |
| 2021/0059954 A1* | 3/2021 | Neikirk | C23C 16/4417 |
| 2021/0156025 A1* | 5/2021 | Wakabayashi | C23C 16/46 |
| 2023/0295802 A1* | 9/2023 | Lin | C23C 16/4417 |
| | | | 118/722 |

* cited by examiner

POWDER-ATOMIC-LAYER-DEPOSITION DEVICE WITH KNOCKER

CROSS-REFERENCE TO RELATED APPLICATIONS

This non-provisional application claims priority claim under 35 U.S.C. § 119(a) on Taiwan Invention Patent Application No. TW110114922 filed on Apr. 26, 2021, Taiwan Invention Patent Application No. TW110114959 filed on Apr. 26, 2021, and Taiwan Invention Patent Application No. TW110114978 filed on Apr. 26, 2021, the entire contents of which are incorporated herein by reference.

TECHNICAL FIELD

The present disclosure relates to a powder-atomic-layer-deposition device with knocker, which includes a knocker adjacent to a vacuum chamber containing powders, for knocking the vacuum chamber to prevent the powders from sticking to an inner surface or wall thereof.

BACKGROUND

Nanoparticle is defined as a particle smaller than 100 nanometer (nm) in at least one dimension, which shows entirely different physical and chemical properties comparing with that in macroscopic scale. Generally, macroscopic matters have all the same physical property, no matter what size they are, however neither do the nanoparticle. Such that, the nanoparticles hold useful potentials in technic fields of biomedicine, optics and electronics, etc.

Quantum dots are semiconductor nanoparticles. Nowadays, II-VI semiconductor materials, such as zinc sulfide (ZnS), cadmium sulfide (CdS) and cadmium selenide (CdSe) are under research, especially the Cdse. A common size of the quantum dot is between 2 nm and 50 nm, and when the quantum dot is exposed to ultraviolet (uv) light, electrons of the quantum dot absorb energy from the uv light and jump from their valence band to their conduction band, then release the energy by emitting light and fall back to the ground state.

The quantum dot possesses a band gap which is size-concerned, when size of the quantum dot is larger, the band gap is smaller as so to emit light with longer wavelength. Then, when the size of the quantum dot is smaller, the band gap is larger as so to emit light with shorter wavelength. For example, quantum dot with a size of 5 nm~6 nm emits orange or red light, quantum dot with a size of 2 nm~3 nm emits blue or green light, the light color may also be defined by ingredient of the quantum dot.

A light-emitting diode employing quantum dots can generate light with proximately continuous spectrum, at same time with high color-rendering index (cri), which improves a quality of light emission. Also, the wavelength of the emitted light can be adjusted via changing size of the quantum dot. Therefore, the quantum dots are significant for development of new-generation lighting devices and displays.

Despite of such advantages and features, the quantum dots may have agglomeration problem occurred often in manufacturing process thereof. Moreover, quantum dots have high surface activity, which can easily react with air and water vapor and shorten a lifetime of the quantum dots.

To be specific, in a process of encapsulating quantum dots by gel to construct light-emitting diode (led), agglomeration may occur to disrupt optical performance of the quantum dots. Also, after gel-encapsulating the quantum dots for constructing the led, environmental oxygen or water vapor may still sneak through the gel layer and contact surfaces of the quantum dots, which causes oxidation of the quantum dots and hence shorten the lifetime of the quantum dots so as the led. Moreover, defects and dangling bonds on the surfaces of the quantum dots may cause non-radiative recombination problem.

Modern industries employ a powder atomic layer deposition (PALD) process to surfaces of quantum dots to form an 1-nanometer-thick thin film, or even multiple layers of thin film thereon as quantum wells.

Via the PALD, it is able to form an evenly-distributed thin film on a substrate and control a thickness of the thin film, as such theoretically, the PALD process can also be adapted to three-dimensional quantum dots. When the quantum dots are secured on a carrier, some adjacent quantum dots may tightly contact each other and hence there is no space therebetween, and thus a precursor gas used in the PALD process is unable to pass therebetween to form complete and evenly-distributed thin films on all of the quantum dots. Moreover for the PALD, a vacuum chamber is commonly employed to contain and process the quantum dots, however during the process, some of the quantum dots may stick to and be fixed on an inner surface of the vacuum chamber, such that the precursor gas is unable to form complete thin films on those stuck quantum dots.

SUMMARY

To overcome the abovementioned technical problems, the present disclosure provides an powder-atomic-layer-deposition (PALD) device with knocker, which mainly includes a knocker disposed adjacent to the vacuum chamber for knocking the vacuum chamber to shake off powders (e.g. quantum dots, etc.) That may stick to an inner surface of the vacuum chamber.

An object of the present disclosure id to provide an powder-atomic-layer-deposition (PALD) device with knocker, which mainly includes a drive unit, a shaft seal, a vacuum chamber and a knocker, wherein the drive unit is connected to a rear wall of the vacuum chamber via the shaft seal. The knocker is adjacent to a front wall of the vacuum chamber, for knocking the front wall or a side wall of the vacuum chamber and shaking an inner wall of the vacuum chamber, in order to knock off, remove those powders sticking to the inner wall thereof.

In general, during a PALD process, it can be difficult to form an evenly-distributed thin film on surfaces of those powders which stick to the vacuum chamber, and hence to cause malicious effect to a product yield, lifetime and performance of the powders. Therefore, the present disclosure provides the PALD device, which employs the knocker to knock the front wall or the side wall of the vacuum chamber, to prevent the powders from sticking on the inner surface of the vacuum chamber.

To achieve the abovementioned object, the present disclosure provides a PALD device with knocker, which includes a vacuum chamber, a shaft seal, a drive unit, at least one gas-extracting pipeline, at least one gas-inlet pipeline and a knocker. The vacuum chamber includes a front wall, a rear wall and a side wall, wherein the front wall faces the rear wall and connect to the rear wall via the side surface. Also the front wall, rear wall and the side wall together define a reacting space for containing a plurality of powders. The shaft seal is connected to the rear wall of the vacuum chamber and includes an outer tube and an inner tube, wherein the outer tube has a containing space for containing the inner tube. The drive unit is connected to the shaft seal, and drives the vacuum chamber to rotate via the shaft seal. The gas-extracting pipeline is positioned within the inner tube and fluidly connected to the reacting space of the vacuum chamber for extracting gas within the reacting space. The gas-inlet pipeline is positioned within the inner tube and fluidly connected to the reacting space of the vacuum chamber, for transferring a precursor gas into the reacting space. The knocker is disposed adjacent to the front wall of the vacuum chamber, for knocking the front wall or the side wall of the vacuum chamber.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
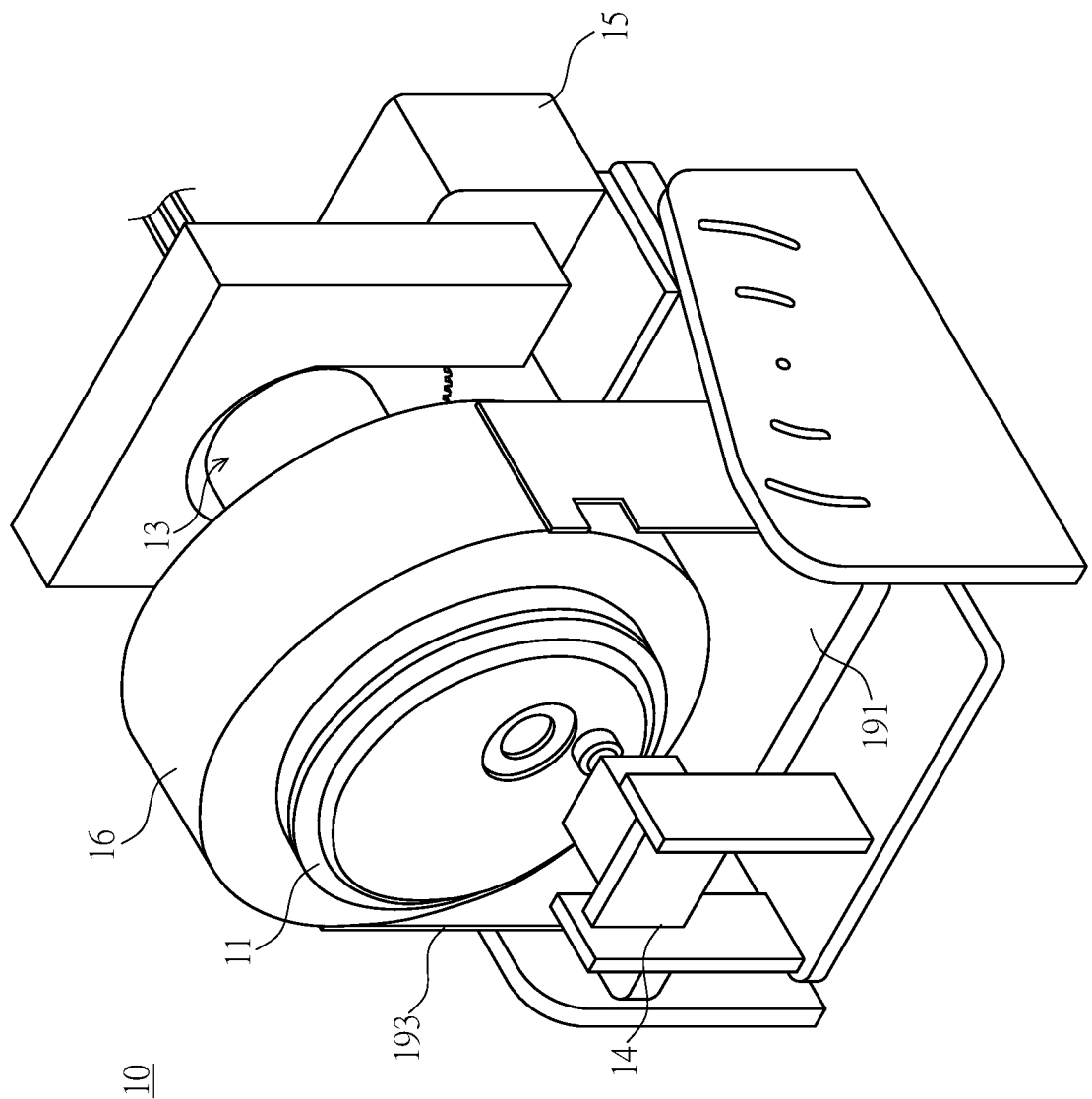
FIG. 1 is a schematic perspective view of a powder-atomic-layer-deposition (PALD) device with knocker, according to one embodiment of the present disclosure.
Figure 2:
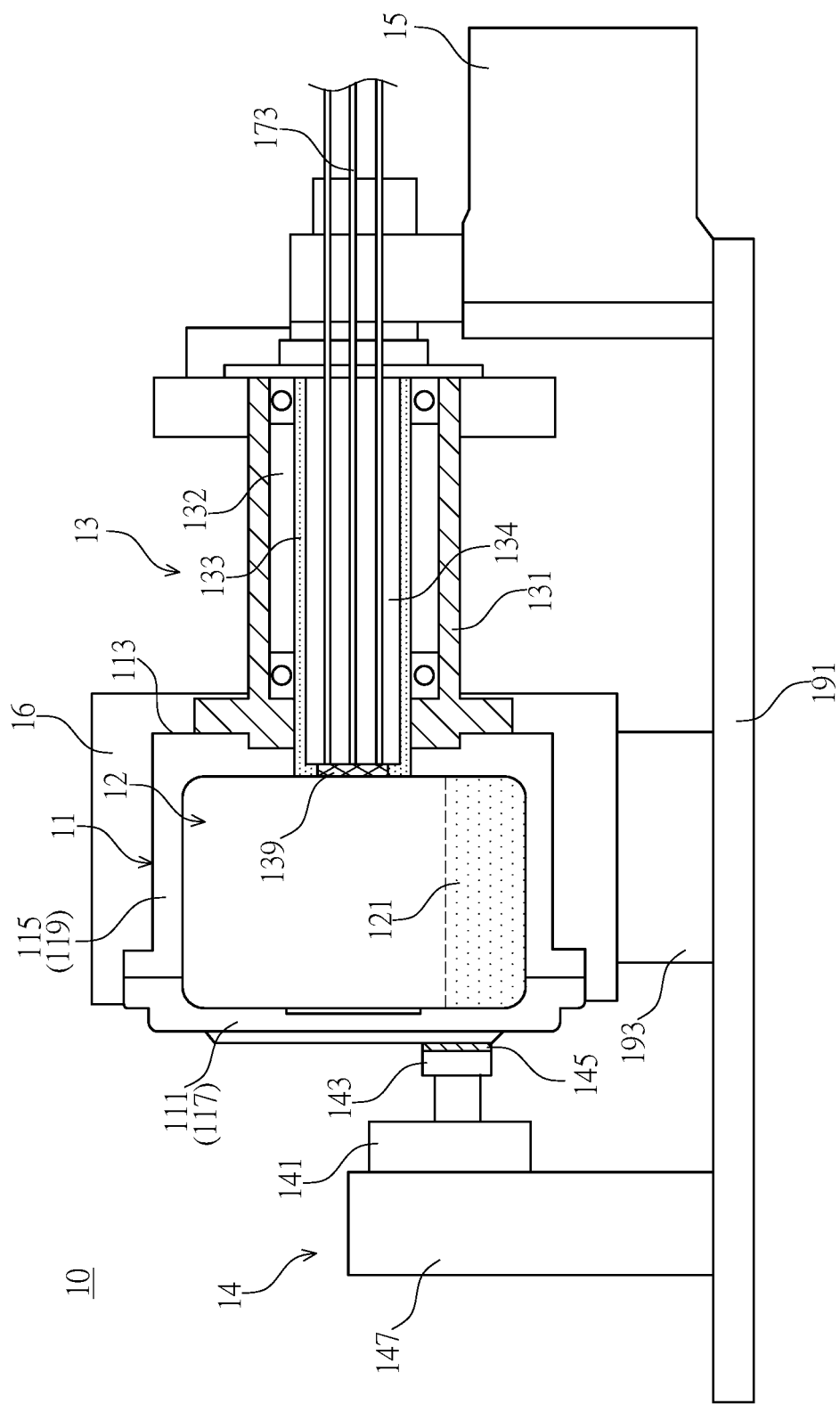
FIG. 2 is a schematic sectional view of the PALD device with knocker, according to one embodiment of the present disclosure.
Figure 3:
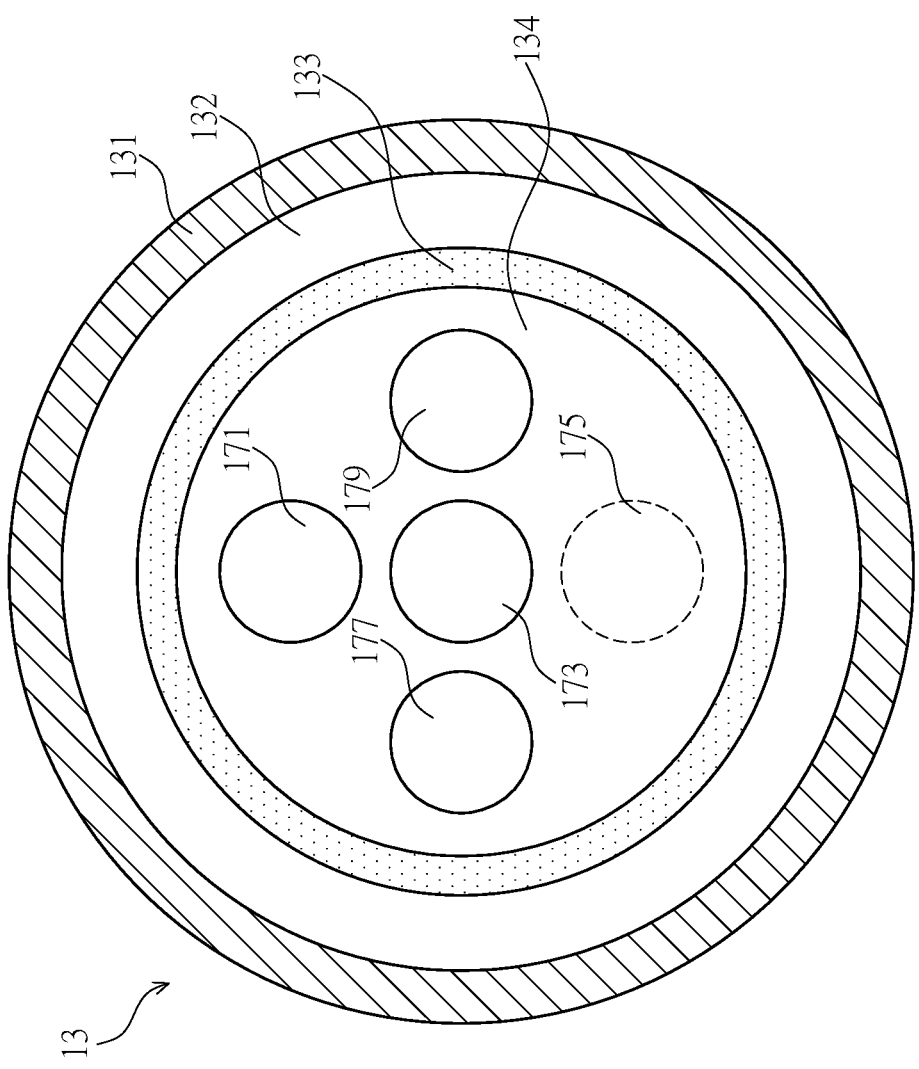
FIG. 3 is a schematic sectional view illustrating a cross-section of an outer tube of the PALD device with knocker, according to one embodiment of the present disclosure.

Referring to FIG. 1, FIG. 2 and FIG. 3, wherein FIG. 1 is a schematic perspective view of an powder-atomic-layer-deposition device with knocker 10 (hereinafter referred to as "PALD device 10"), FIG. 2 is a schematic sectional view of the PALD device 10, and FIG. 3 is a schematic sectional view illustrating a cross-section of an outer tube of the PALD device 10, according to one embodiment of the present disclosure. As shown in FIGs, the PALD device 10 mainly includes a vacuum chamber 11, a shaft seal 13, a drive unit 15 and a knocker 14, wherein the drive unit 15 is connected to the vacuum chamber 11 via the shaft seal 13 for driving the vacuum chamber 11 to rotate.

The vacuum chamber 11 includes a front wall 111, a rear wall 113 and a side wall 115. The front wall 111 faces the rear wall 113, and the side wall 115 is positioned between and interconnects the front wall 111 and the rear wall 113, such that to define a reacting space 12 between the front wall 111, the rear wall 113 and the side wall 115.

The reacting space 12 is for containing a plurality of powders 121, wherein the powders 121 may be quantum dots. Herein, the quantum dots may be made of II-VI semiconductor materials, such as zinc sulfide (ZnS), cadmium sulfide (CdS) and cadmium selenide (CdSe), etc., furthermore, each of the quantum dots may be covered by a thin film of aluminum oxide (Al2O3). In one embodiment according to the present disclosure, the vacuum chamber 11 may include a lid plate 117 and a chamber body 119, wherein the lid plate 117 covers and connects to the chamber body 119, such that to form and define a reacting space 12 therebetween. The lid plate 117 may be the front wall 111 of the vacuum chamber 11, as so the chamber body 119 is constructed by the rear wall 113 and the side wall 115 of the vacuum chamber 11.

The shaft seal 13 is connected to the rear wall 113 of the vacuum chamber 11, and includes an outer tube 131 and an inner tube 133. The outer tube 131 has a containing space 132, the inner tube 133 has a connecting space 134, wherein the outer tube 131 and the inner tube 133 may have hollow-tubular appearances. The containing space 132 of the outer tube 131 is for containing the inner tube 133, wherein the outer tube 131 and the inner tube 133 are disposed concentrically. The shaft seal 13 may be a common shaft seal or a magnetic-fluid seal, mainly for isolating the reacting space 12 of the vacuum chamber 11 from outside and maintaining a vacuum condition within the reacting space 12.

The shaft seal 13 has an end connected to the drive unit 15, and another end connected to the rear wall 113 of the vacuum chamber 11. The drive unit 15 drives the vacuum chamber 11 to rotate via the shaft seal 13. Specifically, the drive unit 15 may be such as a motor connected to the rear wall 113 of the vacuum chamber 11 via the outer tube 131, for driving the vacuum chamber 11 to rotate via the outer tube 131. Furthermore, the drive unit 15 is not connected to the inner tube 133, therefore when the drive unit 15 drives the outer tube 131 and the vacuum chamber 11 to rotate, the inner tube 133 does not rotate along therewith.

The drive unit 15 can drive the outer tube 131 and the vacuum chamber 11 to continuously rotate in one direction, such as clockwise (CW) or counterclockwise (CCW). In a different embodiment, the drive unit 15 may drive the outer tube 131 and the vacuum chamber 11 to rotate CW for a certain degree, then reversely rotate CCW for a certain degree, wherein the certain degrees may all be 360 degrees. When the vacuum chamber 11 rotates, the powders 121 within the reacting space 12 are stirred, blended, such that to contact a precursor gas or inert gas and be heated evenly.

The connecting space of the inner tube 133 may be disposed with at least one gas-extracting pipeline 171, at least one gas-inlet pipeline 173, at least one inert-gas pipeline 175, a heater 177 and/or a thermal-detecting unit 179, as shown in FIG. 2 and FIG. 3.

The gas-extracting pipeline 171 is fluidly connected to the reacting space 12 of the vacuum chamber 11 for gas extraction of the reacting space 12, such that to create a vacuum condition within the reacting space 12 to facilitate a PALD process. Specifically, the gas-extracting pipeline 171 can be connected to a pump, such that to extract gas within the reacting space 12 via the pump.

The gas-inlet pipeline 173 is fluidly connected to the reacting space 12 of the vacuum chamber 11, for transferring a precursor and/or an inert gas into the reacting space 12, wherein the inert gas may be a noble gas such as nitrogen or argon, etc. In practical use, the gas-inlet pipeline 173 may transfer a carrier gas and a precursor gas into the reacting space 12. Also, the gas-inlet pipeline 173 may also transfer an inert gas into the reacting space 12 and extract, remove the precursor gas via the gas-extracting pipeline 171 within the reacting space 12. In one embodiment of the present disclosure, the gas-inlet pipeline 173 may be connected to multiple branched pipelines, and transfer different precursor gases into the reacting space 12 via the branched pipelines in sequence.

The gas-inlet pipeline 173 can increase a flow rate of the inert gas which is transferred into the reacting space 12, to blow the powders 121 within the reacting space 12 via the inert gas, thereby the powders 121 is moved by the inert gas to spread within the entire reacting space 12.

In one embodiment of the present disclosure, the gas-inlet pipeline 173 may include at least one inert-gas pipeline 175 and at least one reactive-gas pipeline. The inert-gas pipeline 175 is fluidly connected to the reacting space 12 of the vacuum chamber 11, for transferring an inert gas into the reacting space 12. Along with the rotation of the vacuum chamber 11 driven by the drive unit 15, the inert gas can blow and effectively blend the powders 121 within the reacting space 12 well, and such that to deposit and form an evenly-distributed thin film on surface of each of the powders 121. in the other hand. the reactive-gas pipeline is fluidly connected to the reacting space 12, for transferring the precursor gas into the reacting space 12.

The drive unit 15 drives vacuum chamber 11 to rotate via the shaft seal 13 and transfers the inert gas into the reacting space 12 via the gas-inlet pipeline 173, such that to stir, blend the powders 121 within the reacting space 12. However, in practical use, a certain amount of the powders 121 may stick to an inner surface of the vacuum chamber 11, which causes the precursor gas transferred into the reacting space 12 unable to fully contact all of the powders 121, and hence unable to form a thin film within evenly-distributed thickness on the surface of each of the powders 121.

To overcome the abovementioned technical problems of the conventional technology, the present disclosure provides the PALD device 10 which has the knocker 14 disposed aside of and adjacent to the front wall 111 of the vacuum chamber 11, for knocking the front wall 111 or the side wall 115 of the vacuum chamber 11.

As the knocker 14 knocks the front wall 111 or the side wall 115 of the vacuum chamber 11, the vacuum chamber 11 shakes, such that the powders 121 sticking to the inner surface of the vacuum chamber 11, which fall off from the inner wall and hence be free to move again within the reacting space 12 of the vacuum chamber 11.

To be specific, by virtue of disposing the drive unit 15, the gas-inlet pipeline 173 and the knocker 14, this can effectively solve the problem of the powders 121 which may stick to the vacuum chamber, and such that to facilitate forming evenly-distributed thin films on surfaces of most of the powders 121.

In one embodiment of the present disclosure, the knocker 14 includes a motor 141 and a knock portion 143. The motor 141 is connected to the knock portion 143 for knocking the front wall 111 or the side wall 115 of the vacuum chamber 11. Moreover, the knock portion 143 may be disposed with a pad portion 145, wherein the knock portion 143 knocks the front wall 111 or the side wall 115 of the vacuum chamber 11, to prevent causing damage to the vacuum chamber 11 and/or the knocker 14 during the knocking process. Also to mention that the pad portion 145 may be such as a rubber pad.

The gas-inlet pipeline 173 and the inert-gas pipeline 175 of the PALD device 10 are all for transferring the inert gas into the reacting space 12, wherein the gas-inlet pipeline 173 transfers a relatively small amount of the inert gas mainly for removing the precursor gas within the reacting space 12, whereas the inert-gas pipeline 175 transfers a relatively large amount of the inert gas mainly for blowing and moving the powders 121 of the reacting space 12.

To be specific, the gas-inlet pipeline 173 and the inert-gas pipeline 175 transfer the inert gas into the reacting space 12 at different timing. Alternatively, according to practical requirements, the inert-gas pipeline 175 may be omitted, only using the gas-inlet pipeline 173 to transfer different amount of the inert gas at different timing. During the process of removing the precursor gas within the reacting space 12, the flow rate of the inert gas transferred into the reacting space 12 may be decreased. In the other hand, during the process of blowing and moving the powders 121 within the reacting space 12, the flow rate of the inert gas transferred into the reacting space 12 may be increased.

When the drive unit 15 according to the present disclosure drives the outer tube 131 and the vacuum chamber 11 to rotate, the inner tube 133 and the gas-extracting pipeline 171, the gas-inlet pipeline 173 and/or the inert-gas pipeline 175 therein do not rotate, such configuration can facilitate to improve a stability of the performance of the gas-inlet pipeline 173 and/or the inert-gas pipeline 175 for stably transferring the inert gas and/or the precursor gas into the reacting space 12.

The heater 177 is for heating the connecting space 134 and the inner tube 133, also for heating gas-extracting pipeline 171, the gas-inlet pipeline 173 and/or the inert-gas pipeline 175 within the inner tube 133, such that to rise a temperature of the gases within the gas-extracting pipeline 171, the gas-inlet pipeline 173 and/or the inert-gas pipeline 175. Thermal-detecting unit 179 is for detecting temperature of the heater 177 or the connecting space 134, such that to help understanding working status of the heater 177. The vacuum chamber 11 commonly is disposed with another heater 16 therein, or thereon externally or even outside environmentally, wherein the heater 16 is positioned adjacent or even contacts the side wall 115 of the vacuum chamber 11, for heating the vacuum chamber 11 and the reacting space 12 therein.

The inner tube 133 has an end connected to the reacting space 12, and the end thereof may be disposed with a filter unit 139. To be specific, the gas-extracting pipeline 171, the gas-inlet pipeline 173 and/or the inert-gas pipeline 175 within the inner tube 133 are fluidly connected to the reacting space 12 of the vacuum chamber 11 via the filter unit 139.

The gas-extracting pipeline 171 are fluidly connected to the reacting space 12 via the filter unit 139, such that to prevent the powders 121 within the reacting space 12 from being extracted thereout during the process of extracting the gases within the reacting space 12, and therefore to save the powders 121 from wasting away.

In one embodiment of the present disclosure, the PALD device 10 may include a carrier member 191 for carrying the drive unit 15, the vacuum chamber 11, the shaft seal 13 and/or the knocker 14. The carrier member 191 may be connected to the drive unit 15 and further connected to the shaft seal 13 and the vacuum chamber 11 via the drive unit 15. Also, the shaft seal 13 and/or the vacuum chamber 11 may be connected to the carrier member 191 via at least one rack 193, to improve a stability of the connection therebetween.

Figure 4:
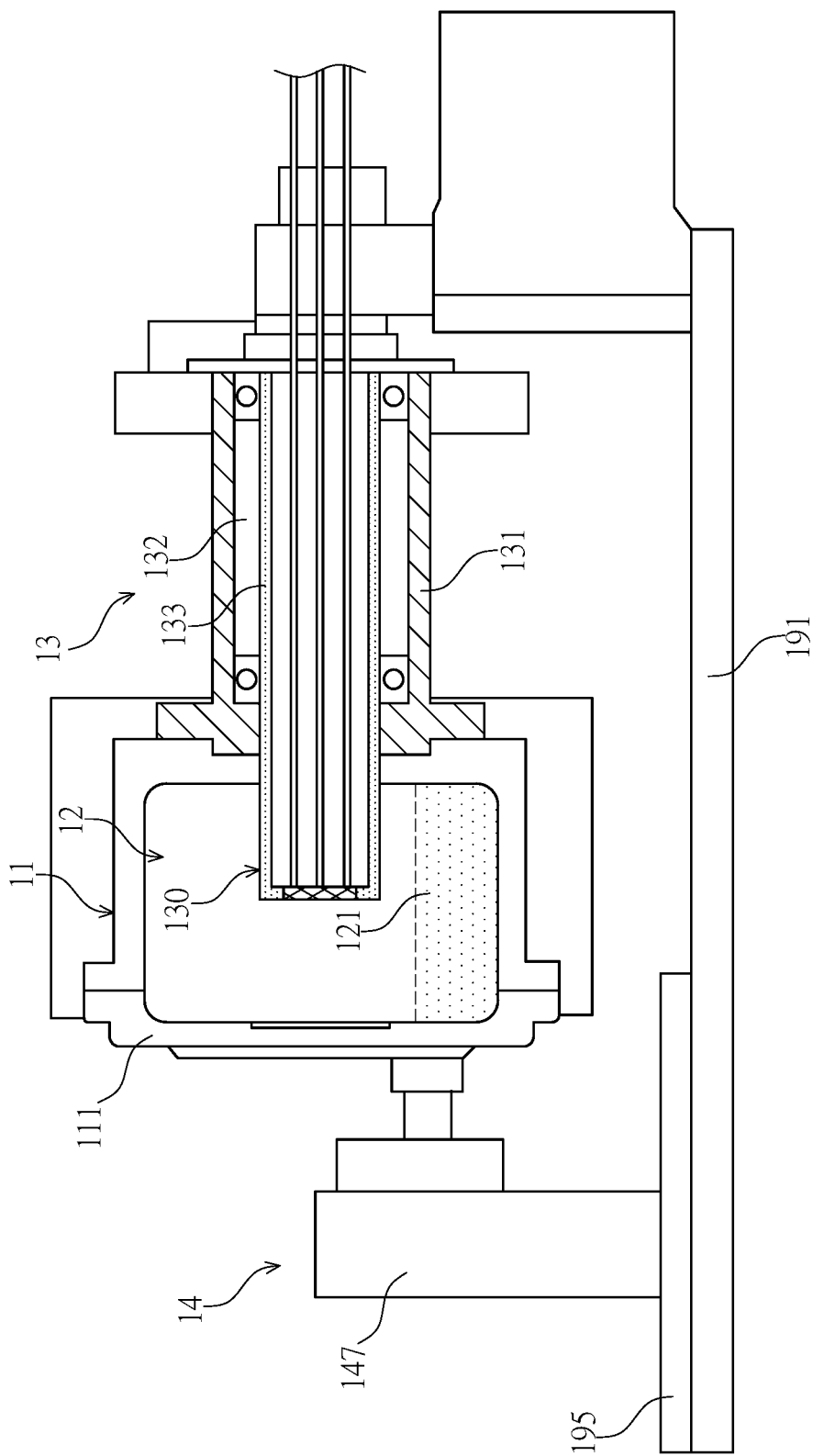
FIG. 4 is a schematic sectional view of the PALD device with knocker, according to another embodiment of the present disclosure.

As shown in FIG. 4, the shaft seal 13 and/or the drive unit 15 may be disposed on the carrier member 191, and the knocker 14 is connected to the carrier member 191 via a position-adjusting mechanism 195, furthermore the knocker 14 may be connected to the position-adjusting mechanism 195 via a turret 147.

The position-adjusting mechanism 195 is for bringing the knocker 14 to move or turn related to the carrier member 191, in order to change the relative distance and/or angle between the knocker 14 and the front wall 111 of the vacuum chamber 11.

In other embodiment, the inner tube 133 of the shaft seal 13 may be configured to extend from the containing space 132 of the outer tube 131 to the reacting space 12 of the vacuum chamber 11, such that the inner tube 133 forms a protruding segment 130 within the reacting space 12.

Figure 6:
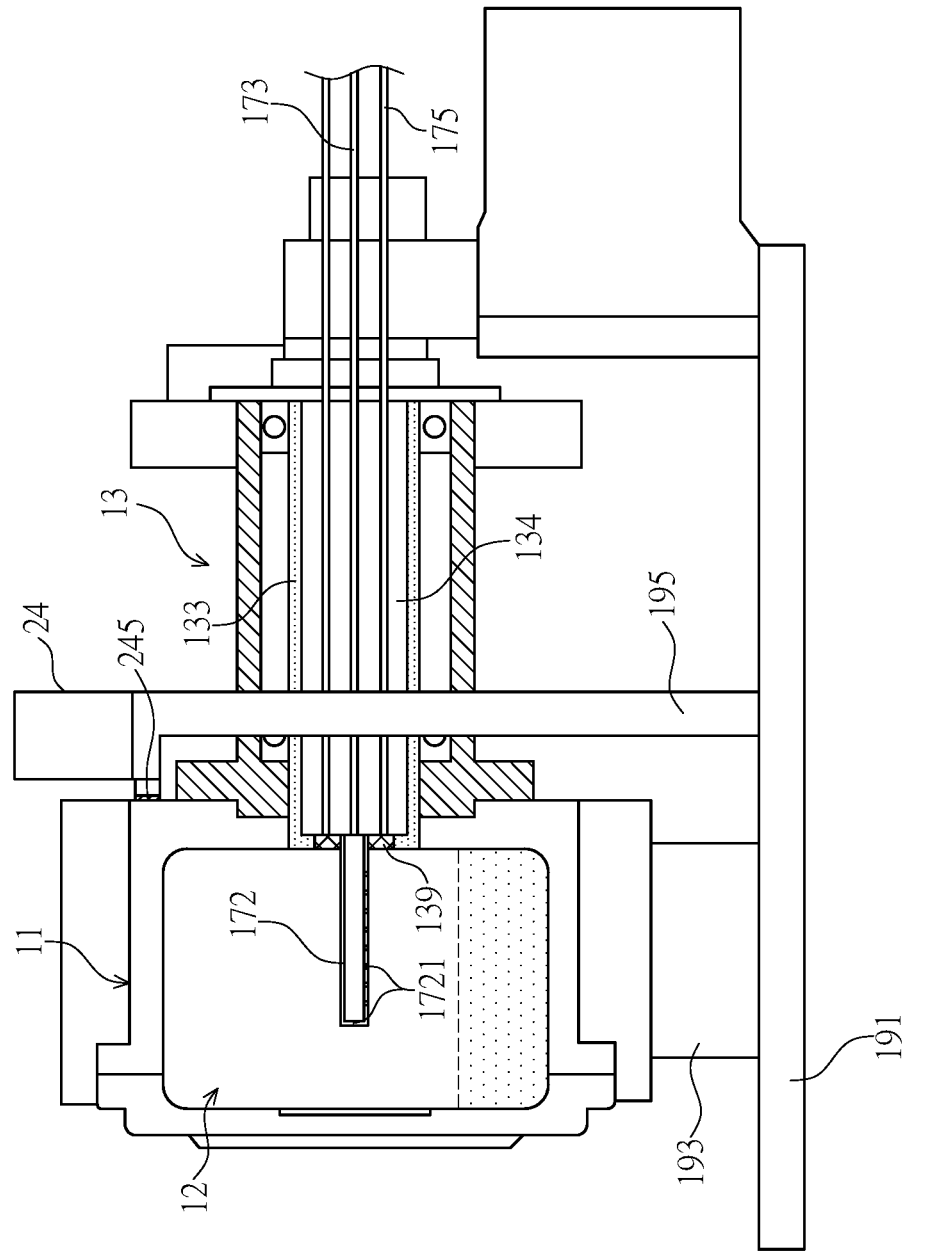
FIG. 6 is a schematic sectional view of the PALD device with knocker, according to another different embodiment of the present disclosure.

In one embodiment according to the present disclosure, the position-adjusting mechanism 195 may be a slide rail, such that the knocker 14 can move related to the vacuum chamber 11 along the slide rail to change the distance between the knocker 14 and the vacuum chamber 11. In a process of deposition, the knocker 14 can move along the slide rail to approach the front wall 111 of the vacuum chamber 11, such that to knock the front wall 111 or the side wall 115 of the vacuum chamber 11, as shown in FIG. 4. As shown in FIG. 6, after the process of deposition is complete, the knocker 14 can move along the slide rail to leave the front wall 111 of the vacuum chamber 11, such that to create a space between the knocker 14 and the front wall 111 of the vacuum chamber 11, for facilitating a dismounting process of the vacuum chamber 11 or the lid plate 117 and removing the powders 121 from the vacuum chamber 11.

In different embodiments, the position-adjusting mechanism 195 may also be a rotary table, the knocker 14 can turn, move angularly related to the vacuum chamber 11 via the rotary table. For example, the knocker 14 move angularly related to the vacuum chamber 11 about a horizontal axial direction or a vertical axial direction, such that to approach the vacuum chamber 11, or leave the vacuum chamber 11 for facilitating the dismounting process of the vacuum chamber 11 or the lid plate 117.

Figure 5:
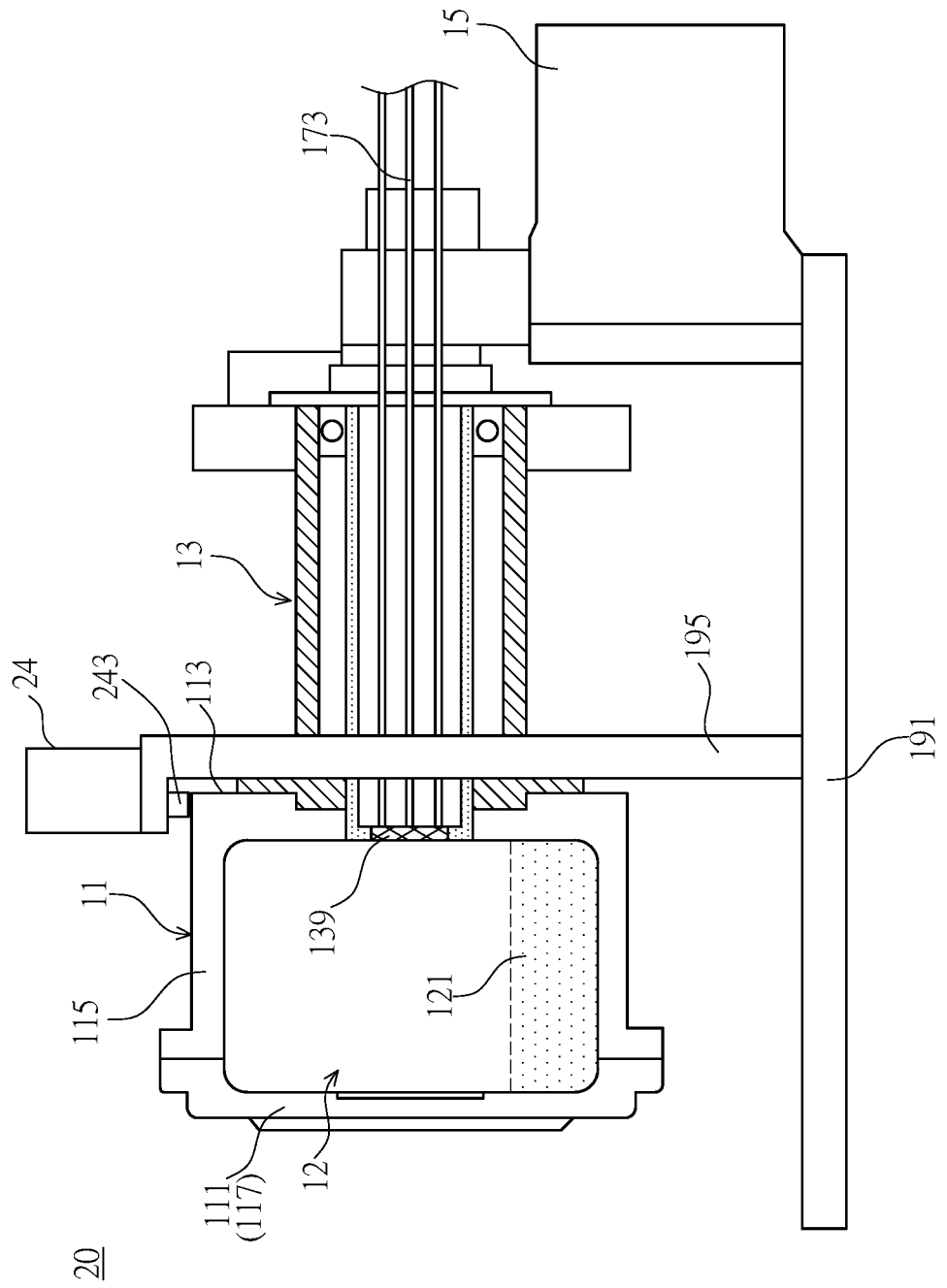
FIG. 5 is a schematic sectional view of the PALD device with knocker, according to another different embodiment of the present disclosure.

Referring to FIG. 5, which is a schematic sectional view of the PALD device 20 with knocker, according to another different embodiment of the present disclosure. The PALD device 20 has a structure similar to the aforementioned embodiment(s), but different in a mounting location of the knocker 24. The knocker 24 is disposed aside and adjacent to the rear wall 113 or the side wall 115 of the vacuum chamber 11, for knocking the rear wall 113 or the side wall 115 thereof.

In one embodiment according to the present disclosure as shown in FIG. 5, the knocker 24 is positioned adjacent to the side wall 115 of the vacuum chamber 11, for knocking the side wall 115. In a different embodiment as shown in FIG. 6, the knocker 24 is positioned adjacent to the rear wall 113 of the vacuum chamber 11, for knocking the rear wall 113 of the vacuum chamber 111. Similar to the aforementioned embodiment, the knocker 24 may also be disposed with a pad portion 245 to prevent causing damage the vacuum chamber 11 and/or the knocker 24 during the knocking process.

According to this embodiment of the present disclosure, the knocker 24 is positioned adjacent to the side wall 115 or the rear wall 113 of the vacuum chamber 11, such that knocker 24 does not interfere a mounting/dismounting process of the vacuum chamber 11 and/or the lid plate 117, to simplify an operation of using of the PALD device 20.

Also, in the embodiment as shown in FIG. 6, the gas-inlet pipeline 173 and/or the inert-gas pipeline 175 may be configured to extend from the connecting space 134 of the inner tube 133 of the shaft seal 13, together as an extension pipeline 172. The extension pipeline 172 may extend through the filter unit 139, and into the reacting space 12.

In one embodiment according to the present disclosure, the gas-inlet pipeline 173, the inert-gas pipeline 175 and/or the extension pipeline 172 within the reacting space 12, those may extend toward the front wall 111 of the vacuum chamber 11. In another different embodiment, those pipelines 172, 173, 175 may be further bent to extend toward the side wall 115 and/or the rear wall 113 of the vacuum chamber 11. In addition, the extension pipeline 172 may include at least one nozzle 1721, wherein the nozzle 1721 faces the front wall 111 and/or the side wall 115 of vacuum chamber 11.

In another embodiment of the present disclosure, the extension pipeline 172 can continuously transfer inert gas into the reacting space 12, and also adjust a flow rate of the inert gas. Specifically, the extension pipeline 172 may output the inert gas with different mode manners as blending mode and normal mode. In the blending mode, the extension pipeline 172 outputs the inert gas with a relatively high flow rated, for transferring the inert gas to stir and blend the powders 121 within the reacting space 12. In the normal mode, the extension pipeline 172 outputs the inert gas with a relatively low flow rate, which is not for blending the powders 121 of the reacting space 12, but for creating a positive pressure from the nozzle(s) 1721 and thereby to prevent the powders 121 from entering the extension pipeline 172 via the nozzle(s) 1721.

Surely, the structure of the extension pipeline 172 is not limited to the embodiment as shown in FIG. 6, such structure may also be applied in the embodiments as shown in FIG. 2 and FIG. 4, and be combined with the knocker 14 in different configurations.

Figure 7:
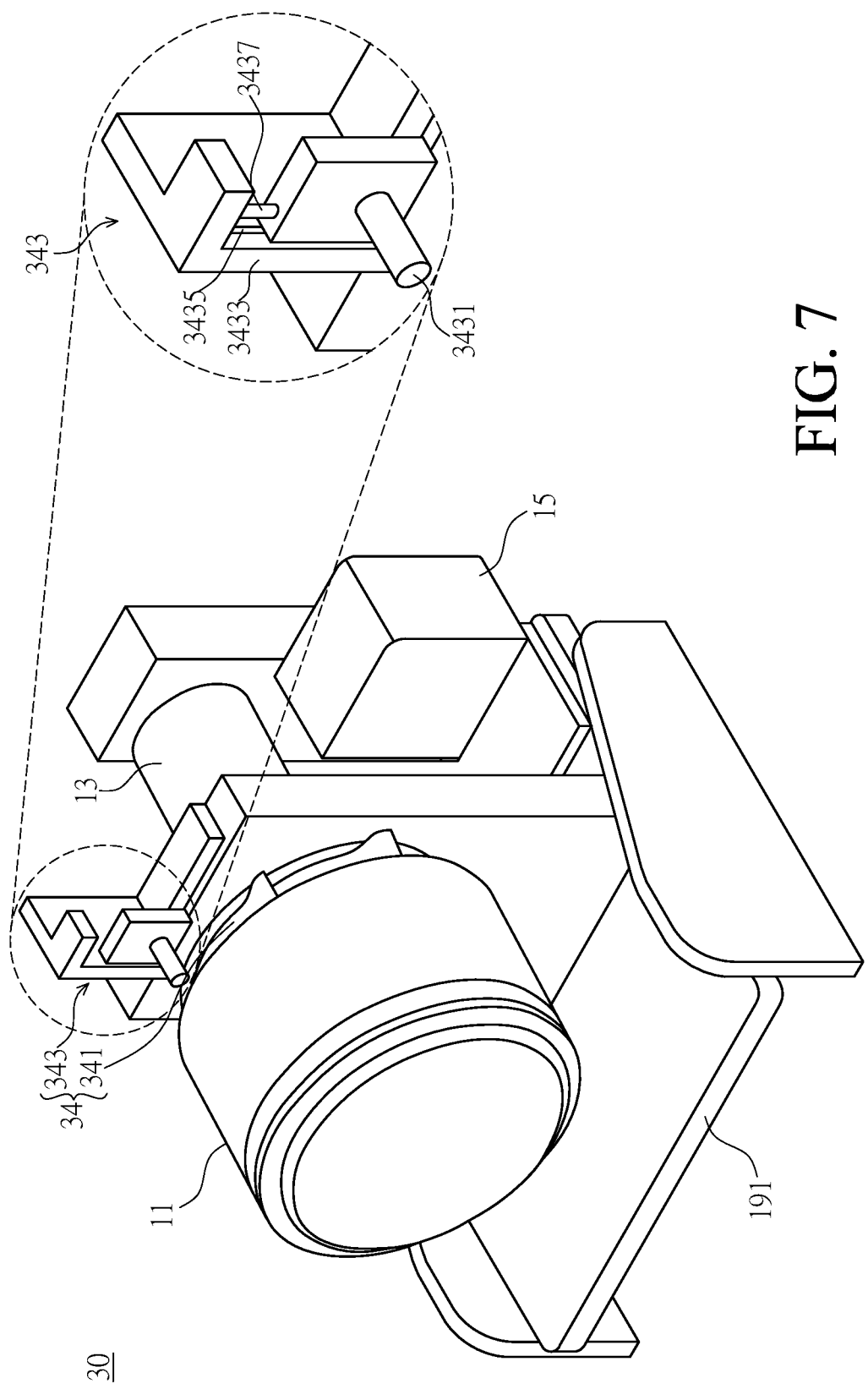
FIG. 7 is a schematic perspective view of the PALD device with knocker, according to yet another different embodiment of the present disclosure.
Figure 8:
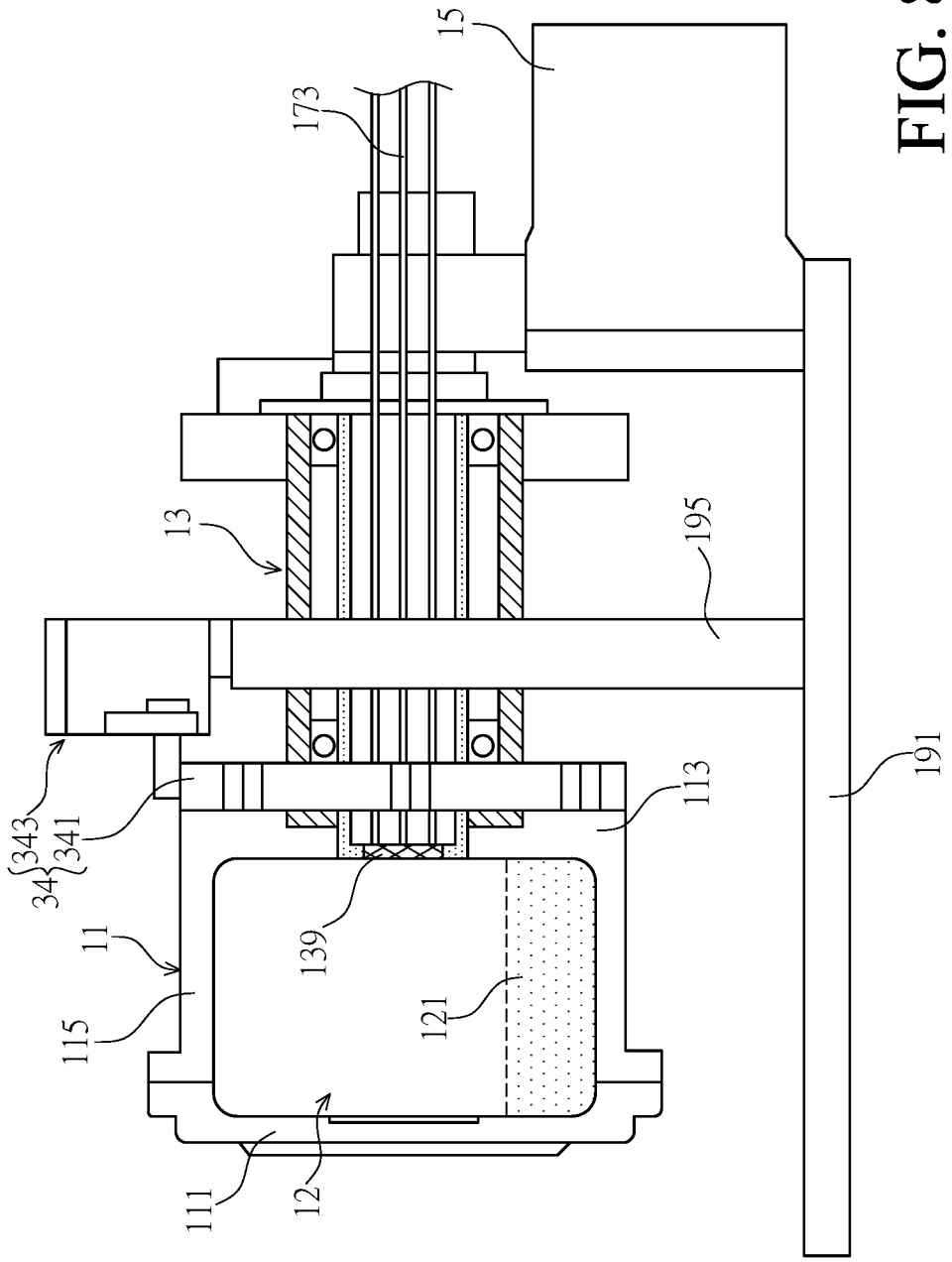
FIG. 8 is a schematic sectional view of the PALD device with knocker, according to yet another different embodiment of the present disclosure.

Referring to FIG. 7 and FIG. 8, wherein FIG. 7 is a schematic perspective view of the PALD device 30, and FIG. 8 is a schematic sectional view of the PALD device 30, according to yet another different embodiment of the present disclosure. The PALD device 30 is similar to the aforementioned embodiment(s), however different in a structure of the knocker 34.

In this embodiment, the knocker 34 includes a ring member 341 and a knock unit 343, wherein the knock unit 343 and the ring member 341 contact each other. The ring member 341 is connected to the vacuum chamber 11 or the shaft seal 13 and rotates with the shaft seal 13 and/or the vacuum chamber 11. Furthermore, the ring member 341 may be fastened on the rear wall 113 or the side wall 115 of the vacuum chamber 11 by bolts, or by fitting to attach on the shaft seal 13.

Figure 9:
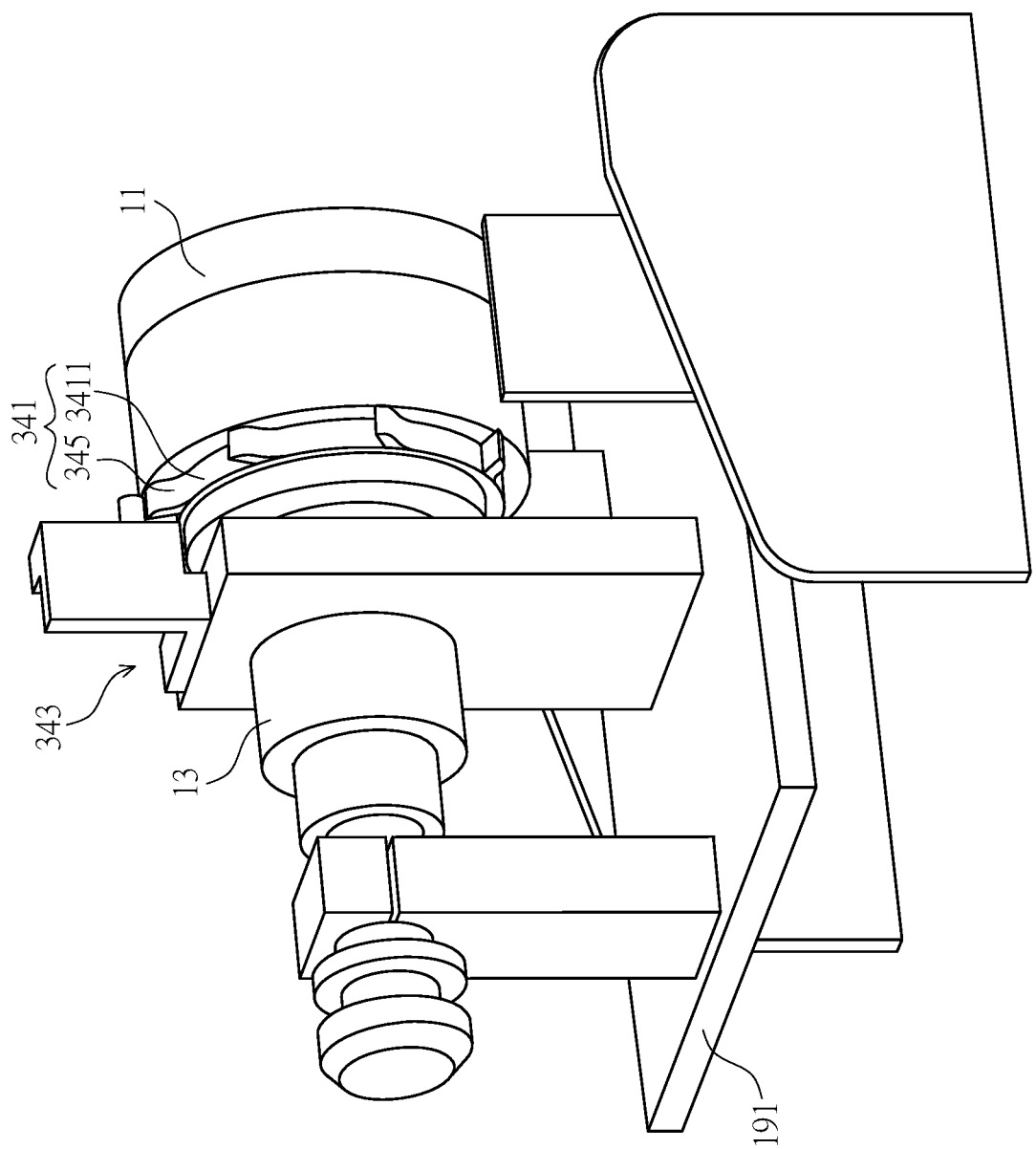
FIG. 9 is another schematic perspective view of the PALD device with knocker, according to yet another different embodiment of the present disclosure.
Figure 10:
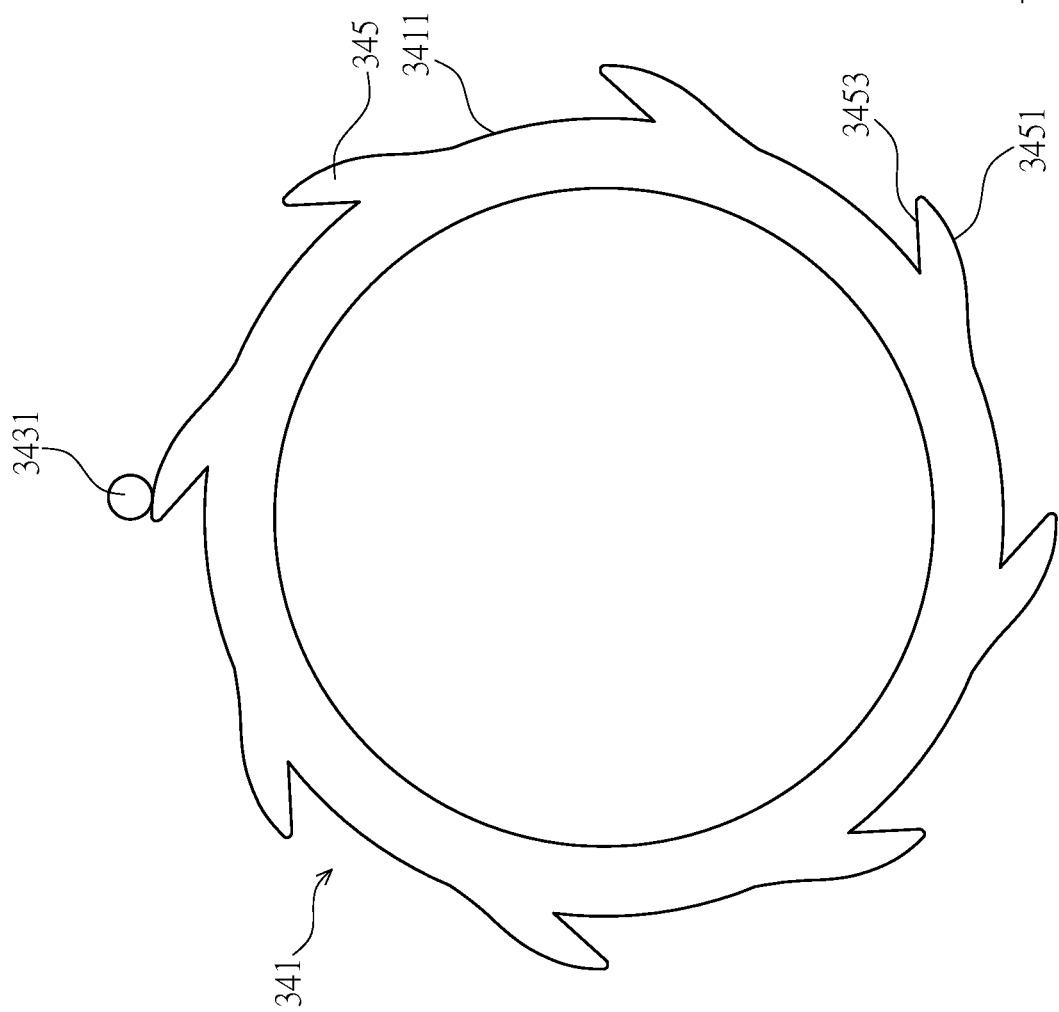
FIG. 10 is schematic view illustrating a ring member of the PALD device with knocker, according to yet another different embodiment of the present disclosure.

As shown in FIG. 9 and FIG. 10, the ring member 341 has a ring surface 3411 disposed with at least one protrusion 345 (plural in this embodiment), wherein the protrusions 345 may be disposed to protrude radial-outward from the ring member 341 and incline, bend in one rotational direction (e.g. CW or CCW). In one embodiment according to the present disclosure, each of the protrusion 345 of the ring member 341 includes a first surface 3451 and a second surface 3453. Both of the first surface 3451 and the second surface 3453 respectively have one sides connected to the ring surface 3411 of the ring member 341, and also respectively have another sides connected to each other. The first surface 3451 and the second surface 3453 have an angle greater than 90 degrees therebetween, also, the second surface 3453 and the ring surface 3411 have an angle less than 90 degrees therebetween.

The knocker unit 343 and the ring member 341 are disposed adjacent to each other. When the ring member 341 rotates, the knocker unit 343 moves between the protrusions 345 of the ring member 341 and the ring surface 3411, to knock the ring surface 3411 of the ring member 341 or the vacuum chamber 11.

Specifically, the knocker unit 343 includes a knock portion 3431 and a fixed portion 3433, wherein the knock portion 3431 is connected to the fixed portion 3433 and movable related to the fixed portion 3433. The knock portion 3431 may be connected to the fixed portion 3433 via at least one guide unit 3435. The guide unit 3435 may be a guide rail or guide slot, which allows the knock portion 3431 to move along and move related to the fixed portion 3433. The knock portion 3431 of the knock unit 343 contacts a radial exterior of the ring member 341, such that when the ring member 341 rotates, the knock portion 3431 moves back and forth between the protrusions 345 and the ring surface 3411. To be specific, when the ring member 341 rotates with the vacuum chamber 11 and/or the shaft seal 13, the knock portion 3431 moves along the ring surface 3411 to the first surface 3451 of the protrusions 345, then moves along the first surface 3451 toward the fixed portion 3433 and away from the ring surface 3411. Thereafter, when the knock portion 3431 moves to an edge between the first surface 3451 and the second surface 3453, the knock portion 3431 moves from the protrusion 345 toward the ring surface 3411, and then to knock and hit the ring surface 3411 of the ring member 341 and/or the vacuum chamber 11. In one embodiment of the present disclosure, as each of the protrusions 345 bends to side of the second surface 3435, when the ring member 341 rotates, the knock portion 3431 may move from the ring surface 3411 to climb the protrusions 345 by the first surfaces 3451 thereof, such that the knock portion 3431 may never contact the second surface 3435 during the knocking process.

In one embodiment of the present disclosure, the knock unit 343 may be disposed on an upper portion of the ring member 341, as such when the ring member 341 rotates related to the knock unit 343, the knock portion 3431 is affected by gravity to move downward or drop from the protrusion 345 toward the ring surface 3411 to hit, knock the ring member 341. In practical use, the knock portion 3431 may be formed with a heavy weight or be connected to a weight mass, such that to increase a force of the knock portion 3431 when knocking the ring member 341 and/or the vacuum chamber 11.

As shown in FIG. 7, in another embodiment of the present disclosure, the knock portion 3431 may be connected to a spring unit 3437, in a manner such as to have the knock portion 3431 connects to the fixed portion 3433 via the spring unit 3437, such that to utilize a restoring force of the spring unit 3437 for moving the knock portion 3431 from the protrusions 345 toward the ring surface 3411.

Such that, the knock portion 3431 can knock the ring member 341 and/or the side wall 115 of the vacuum chamber 11 to shake the vacuum chamber 11, and thereby to shake off the powders 121 sticking to the inner surface or inner wall of the vacuum chamber 11, and therefore to solve the problem of the stuck powders 121, and to facilitate forming an evenly-distributed thin film on most of the powders 121.

Also, similar to the aforementioned embodiment, the knock portion 3431 may also be disposed with a pad portion, to knock the ring member 341 and/or the side wall 115 of the vacuum chamber 11 via the pad portion, such that to prevent causing damage to the vacuum chamber 11 and/or the knocker 34 during the knocking process.

It should be noted, the knocker 34 itself in this embodiment requires no drive unit (e.g. motor) to operate, the knocker 34 is simply triggered to operate by the ring member 341 which is disposed on the vacuum chamber 11 or the shaft seal 13, and which rotates as the drive unit 15 drives the shaft seal 13 and the vacuum chamber 11 to rotate, thereby the knock portion 3431 moves back and forth between the protrusion 345 and the ring surface 3411 to repeatedly knock the ring member 341 and/or the vacuum chamber 11.

Furthermore, in practical use, the ring member 341 of the knocker 34 may be disposed on the rear wall 113 of the vacuum chamber 11, and the knock portion 3431 may be configured to extend from the ring member 341 to the side wall 115 of the vacuum chamber 11, such that the knock portion 3431 can knock both the ring surface 3411 of the ring member 341 and the side wall 115 of the vacuum chamber 11, this may further facilitate the process of knocking off the stuck powders 121.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. A powder-atomic-layer-deposition device with knocker, comprising:
   a vacuum chamber comprising a front wall, a rear wall and a side wall, wherein the front wall faces the rear wall and connects to the rear wall via the side wall, and wherein the front wall, the rear wall and the side wall together define a reacting space for containing a plurality of powders;
   a shaft seal connected to the rear wall of the vacuum chamber and comprising an outer tube and an inner tube, wherein the outer tube has a containing space for containing the inner tube;
   a drive unit connected to the shaft seal for driving the vacuum chamber to rotate via the shaft seal;
   at least one gas-extracting pipeline positioned within the inner tube and fluidly connected to the reacting space of the vacuum chamber for gas extraction of the reacting space;
   at least one gas-inlet pipeline positioned within the inner tube and fluidly connected to the reacting space of the vacuum chamber for transferring a precursor gas into the reacting space; and
   a knocker disposed adjacent to the vacuum chamber for knocking the vacuum chamber,
   wherein the at least one gas-inlet pipeline comprises at least one inert-gas pipeline and at least one reactive-gas pipeline, and wherein the at least one inert-gas pipeline is for transferring an inert gas into the reacting space for blowing the powders within the reacting space, and the at least one reactive-gas pipeline is for transferring the precursor gas into the reacting space;
   wherein the at least one inert-gas pipeline comprises an extension pipeline, and wherein the extension pipeline is positioned within the reacting space and extends toward the front wall of the vacuum chamber.

2. The powder-atomic-layer-deposition device with knocker according to claim 1, wherein the knocker is disposed adjacent to the front wall of the vacuum chamber, for knocking the front wall or the side wall of the vacuum chamber.

3. The powder-atomic-layer-deposition device with knocker according to claim 2, wherein the knocker comprises a motor and a knock portion, and wherein the motor is connected to the knock portion for driving the knock portion to knock the front wall or the side wall of the vacuum chamber.

4. The powder-atomic-layer-deposition device with knocker according to claim 3, wherein the knocker comprises a pad portion connected to the knock portion, and wherein the knock portion knocks the front wall and the side wall of the vacuum chamber via the pad portion.

5. The powder-atomic-layer-deposition device with knocker according to claim 2, further comprising a carrier member and a position-adjusting mechanism, wherein the shaft seal and the drive unit are disposed on the carrier member, and wherein the knocker is connected to the carrier member via the position-adjusting mechanism, and the position-adjusting mechanism drives the knocker to move or turn related to the carrier member for changing a distance between the knocker and the vacuum chamber.

6. The powder-atomic-layer-deposition device with knocker according to claim 1, further comprising a filter unit that is disposed at an end of the inner tube connected to the reacting space, wherein the at least one gas-extracting pipeline is fluidly connected to the reacting space via the filter unit, and wherein the extension pipeline extends through the filter unit.

7. The powder-atomic-layer-deposition device with knocker according to claim 1, wherein the extension pipeline comprises at least one nozzle facing the front wall or the side wall of the vacuum chamber.

8. The powder-atomic-layer-deposition device with knocker according to claim 1, wherein the inner tube extends from the containing space of the outer tube to the reacting space of the vacuum chamber, such that to form a protruding segment within the reacting space.

9. The powder-atomic-layer-deposition device with knocker according to claim 1, further comprising a heater disposed adjacent to the side wall of the vacuum chamber, for heating the powders of the vacuum chamber.

10. The powder-atomic-layer-deposition device with knocker according to claim 1, wherein the knocker is positioned adjacent to the rear wall or the side wall of the vacuum chamber, for knocking the rear wall or the side wall of the vacuum chamber.

11. The powder-atomic-layer-deposition device with knocker according to claim 10, wherein the knocker comprises a motor and a knock portion, and wherein the motor is connected to the knock portion for driving the knock portion to knock the rear wall or the side wall of the vacuum chamber.

12. The powder-atomic-layer-deposition device with knocker according to claim 11, wherein the knocker comprises a pad portion connected to the knock portion, and wherein the knock portion knocks the rear wall or the side wall of the vacuum chamber via the pad portion.

13. A powder-atomic-layer-deposition device with knocker, comprising:
- a vacuum chamber comprising a reacting space for containing a plurality of powders;
- a shaft seal connected to the vacuum chamber and comprising an outer tube and an inner tube, wherein the outer tube has a containing space for containing the inner tube;
- a drive unit connected to the shaft seal and driving the vacuum chamber to rotate via the shaft seal;
- at least one gas-extracting pipeline positioned within the inner tube fluidly connected to the reacting space of the vacuum chamber for gas extraction of the reacting space;
- at least one gas-inlet pipeline positioned within the inner tube and fluidly connected to the reacting space of the vacuum chamber for transferring a precursor gas into the reacting space; and
- a knocker comprising a ring member that is connected to the shaft seal or the vacuum chamber and that rotates with the shaft seal, and a knock unit that is positioned adjacent to the ring member, wherein the ring member has a ring surface disposed with at least one protrusion, and wherein when the ring member rotates, the knock unit moves between the protrusion and the ring surface of the ring member to knock the ring surface or the vacuum chamber of the ring member.

14. The powder-atomic-layer-deposition device with knocker according to claim 13, wherein the knock unit comprises a knock portion and a fixed portion, and wherein the knock portion is connected to the fixed portion to move related to the fixed portion and the ring member.

15. The powder-atomic-layer-deposition device with knocker according to claim 14, wherein the knock unit comprises a spring unit connected to the knock portion, and wherein the spring unit provides a restoring force for moving the knock portion toward the ring member.

16. The powder-atomic-layer-deposition device with knocker according to claim 14, wherein the knock unit comprises a pad portion connected to the knock portion, and wherein the knock portion knocks the vacuum chamber or the ring member.

17. The powder-atomic-layer-deposition device with knocker according to claim 13, wherein the at least one protrusion comprises a first surface and a second surface, both of the first surface and the second surface respectively have one sides connected to the ring surface of the ring member and respectively have another sides connected to each other, and wherein the second surface and the ring surface of the ring member have an angle of 90 degrees therebetween.

18. The powder-atomic-layer-deposition device with knocker according to claim 13, wherein the vacuum chamber comprises a front wall and a rear wall facing each other, and the rear wall is connected to the shaft seal, and wherein the at least one gas-inlet pipeline comprises an extension pipeline positioned within the reacting space and extending toward the front wall of the vacuum chamber.

* * * * *